United States Patent [19]

King et al.

[11] Patent Number: 5,281,552
[45] Date of Patent: Jan. 25, 1994

[54] MOS FABRICATION PROCESS, INCLUDING DEPOSITION OF A BORON-DOPED DIFFUSION SOURCE LAYER

[75] Inventors: Clifford A. King, Union County; Byung G. Park, Scotch Plains, both of N.J.

[73] Assignee: AT&T Bell Laboratories, Murray Hill, N.J.

[21] Appl. No.: 23,825

[22] Filed: Feb. 23, 1993

[51] Int. Cl.$^5$ .................................. H01L 21/20
[52] U.S. Cl. .................. 437/131; 437/141; 437/162; 437/950; 148/DIG. 59
[58] Field of Search ............... 437/131, 141, 160, 162, 437/200, 950; 148/DIG. 58, DIG. 59, DIG. 144

[56] References Cited

PUBLICATIONS

Sanganeria et al. "Rapid Thermal Chemical Vapor Deposition of in-situ doped Polycrystalline $Si_xGe_{1-x}$", Jr. of Electronic Materials 21(1992), 61–64.
Ozturk et al. "Rapid Thermal Chemical Vapor Deposition of Germanium on Silicon and Silicon Dioxide and New Applications of Ge in ULSI Technologies", Jr. of Electronic Materials 19(1990), 1129–1134.
S. K. Ghandhi "VLSI Fabrication Principles", John Wiley & Sons, New York (1982), pp. 233–234.
Ashburn et al. "Formation of Ti and Co Germanides on Si(100) Using Rapid Thermal Processing" Jr. Elec. Materials 21(1992) pp. 81–86.
Ishii et al. "Selective Ge deposition on Si using thermal decomposition of $GeH_4$" Appl. Phys. Letts. 47 (1985) 863–865.
D. T. Grider et al., "Ultra-Shallow Junction Formation by Diffusion from Polycrystalline $Si_xGe_{1-x}$ Alloys," 1991 Electron. Mater. Conf., Boulder, Colo.
K. Koyama et al., "Etching characteristics of $Si_{1-x}Ge_x$ alloy in ammoniac wet cleaning," Appl. Phys. Lett. 57, 1990, pp. 2202–2204.
Kunihiro Suzuki et al., "Constant Boron Concentration Diffusion Source of Ion-Implanted Polycrystalline Silicon for Forming Shallow Junctions in Silicon," J. Electrochem. Soc. 138, 1991, pp. 2201–2205.
M. Miyake, "Diffusion of Boron into Silicon from Borosilicate Glass Using Rapid Thermal Processing," J. Electrochem. Soc. 138, 1991, pp. 3031–3039.

Primary Examiner—Robert Kunemund
Assistant Examiner—Ramamohan Rao Paladugu
Attorney, Agent, or Firm—Martin I. Finston

[57] ABSTRACT

A method is described for making at least one MOS transistor on a silicon substrate. According to this method, a layer of a silicon dioxide material is formed on a principal surface of the substrate. The oxide layer is then patterned such that at least one source region and at least one drain region of the substrate are exposed. A layer of boron-doped germanium is then deposited on the exposed regions by RTCVD. The substrate is then heated such that boron diffuses from the germanium layer into the source and drain regions. The substrate principal surface can then be etched such that the germanium layer is removed with high selectivity.

15 Claims, 1 Drawing Sheet

MOS FABRICATION PROCESS, INCLUDING DEPOSITION OF A BORON-DOPED DIFFUSION SOURCE LAYER

FIELD OF THE INVENTION

The invention relates to the fabrication of MOS integrated circuits in which boron is used as a dopant. More particularly, the invention relates to the formation of ultra-shallow p+−n junctions in MOS devices having very small channel lengths.

ART BACKGROUND

Designers of MOS integrated circuits are turning increasingly toward active devices having channel lengths that are a small fraction of 1 μm. However, these efforts to miniaturize are complicated by the emergence of undesirable, short-channel effects. One method for avoiding at least some of these effects is to fabricate devices having ultrashallow source and drain junctions; i.e., junctions that are made as shallow as possible without unacceptably increasing the sheet resistances of the corresponding doped silicon regions. It has proven relatively simple to form n+−p junctions (i.e., junctions between n+ source or drain regions and a p-type substrate portion) that are ultrashallow, because suitable n-type dopants are available. For example, arsenic can be implanted without undesirable channeling effects, and it has a high solid solubility in silicon.

However, most of the available p-type dopants do not have sufficient solid solubility in silicon for making p+−n junctions. Boron is generally the only practical choice for this purpose. However, it is difficult to make shallow junctions by ion implantation of boron, because exhibits channeling behavior.

Extremely shallow, boron-doped p+−n junctions (hereinafter referred to as "boron junctions") have, in fact, been made by low energy ion implantation followed by rapid thermal annealing (RTA). However, the resulting junctions exhibited relatively high sheet resistance, and the control of the junction depth was complicated by channeling effects (during implantation) and transient diffusion (during annealing).

Some practitioners have sought to overcome the deficiencies of this approach by using a boron-doped, deposited layer as a diffusion source. In one such approach, a layer of silicon-germanium (SiGe) alloy is deposited by rapid thermal chemical vapor deposition (RTCVD) on a silicon substrate. Boron is implanted into the SiGe layer. The desired junctions are then formed by rapid thermal annealing. This approach is described, for example, in D. T. Grider et al., "Ultra-Shallow Junction Formation by Diffusion from Polycrystalline $Si_xGe_{1-x}$ Alloys, " 1991 *Electron. Mater. Conf.*, Boulder, Colo. Because the diffusion source is created in two separate steps, this approach adds an extra step to the manufacturing process. However, it is generally preferable to avoid adding extra process steps, in order to minimize manufacturing costs.

A boron-doped, SiGe layer formed without ion implantation is described in M. Sanganeria et al., "Rapid Thermal Chemical Vapor Deposition of in-situ Boron Doped Polycrystalline $Si_xGe_{1-x}$," *J. Electron. Mater.* 21 (1992) 61–64. In the process described there, boron is incorporated during layer deposition by reacting a flow of diborane ($B_2H_6$) in the RTCVD chamber. The resulting layer comprises boron-doped $Si_{0.7}Ge_{0.3}$. In at least some fabrication sequences, it will be desirable to remove the diffusion source after the source and drain junctions have been formed. This is conveniently done by etching with a solvent that dissolves the material of the diffusion source more rapidly than the underlying silicon. This selectivity relaxes constraints on the etching time, and therefore tends to increase process yield. However, at least some of the commonly used enchants exhibit relatively low selectivity for $Si_{0.7}Ge_{0.3}$ over pure silicon.

SUMMARY OF THE INVENTION

We have found that a layer of boron-doped germanium makes an excellent diffusion source. Accordingly, the invention in one aspect is a method for making at least one MOS transistor on a silicon substrate. At least a portion of the substrate is n-type. According to the inventive method, a layer of silicon dioxide material is formed on a principal surface of the substrate that overlies the n-type portion. The oxide layer is then patterned such that at least one source region and at least one drain region of the substrate are exposed. A layer of boron-doped germanium is then deposited on the exposed regions by RTCVD. The substrate is then heated such that boron diffuses from the germanium layer into the source and drain regions. The substrate principal surface can then be etched such that the germanium layer is removed with high selectivity.

DETAILED DESCRIPTION OF A PREFERRED EMBODIMENT

Figure 1:
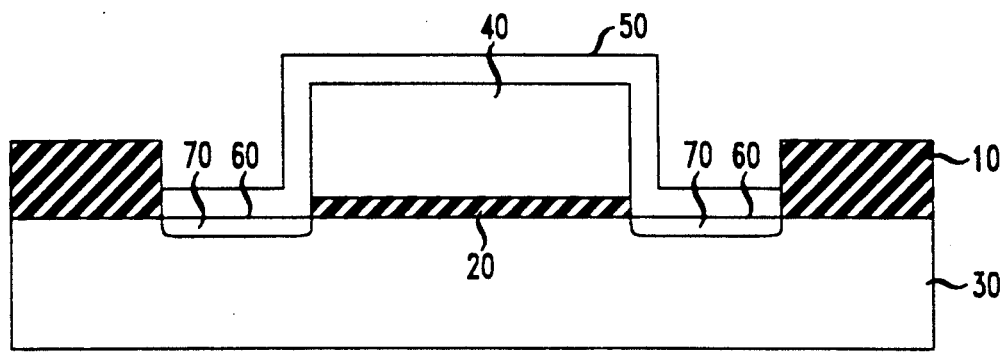
FIG. 1 is a schematic, cross-sectional view of a silicon wafer at an early stage of processing according to the invention.

According to an exemplary sequence for fabricating p-channel MOSFETs, a patterned field oxide layer 10 and a patterned gate oxide layer 20 are formed by conventional methods on the surface of n-type silicon substrate 30, as shown in FIG. 1. A polysilicon gate electrode 40 is then conventionally formed over gate oxide layer 20.

The substrate is then placed in an RTCVD reactor, and boron-doped germanium layer 50 is grown from an atmosphere comprising germane ($GeH_4$), hydrogen, and diborane ($B_2H_6$). Significantly, we have found that layer 50 can be deposited selectively. That is, layer 50 will form on exposed silicon surfaces 60 of substrate 30 and on the exposed surfaces of polysilicon electrode 40, but will not form on field oxide 10. Details of the formation of layer 50 are described in Example 1, below. We have found that the growth conditions described there lead to a heavily twinned, epitaxial germanium layer. However, it is not necessary for this layer to be epitaxial in order to function as a diffusion source. Thus, for example, a polycrystalline layer will serve equally well.

The substrate is then heated, preferably by rapid thermal annealing (RTA) within the RTCVD reactor, to diffuse the boron dopant from layer 50 into source and drain regions 70 and gate electrode 40. Layer is then removed by etching. We have found that a useful etchant for this purpose is a liquid etchant composed of ammonium hydroxide, hydrogen peroxide, and water. (We prefer to use a composition having the respective, relative proportions 1:1:5, although other proportions will also be effective.) We found that a 30-nm-thick germanium layer was effectively removed after etching for five minutes at room temperature. Significantly, this etchant exhibited relatively high selectivity. That is, it dissolved the germanium layer much more rapidly than it dissolved the substrate (if at all). We believe that this etchant dissolves germanium more than 1000 times more rapidly than it dissolves silicon. In fact, a similar solution, having the respective, relative proportions 1:6:20, has been reported to dissolve germanium about 40,000 times more rapidly than silicon. (See, for example, K. Koyama et al., "Etching characteristics of $Si_{1-x}Ge_x$ alloy in ammoniac wet cleaning," *Appl. Phys. Lett.* 57 (1990) 2202-2204.)

Figure 2:
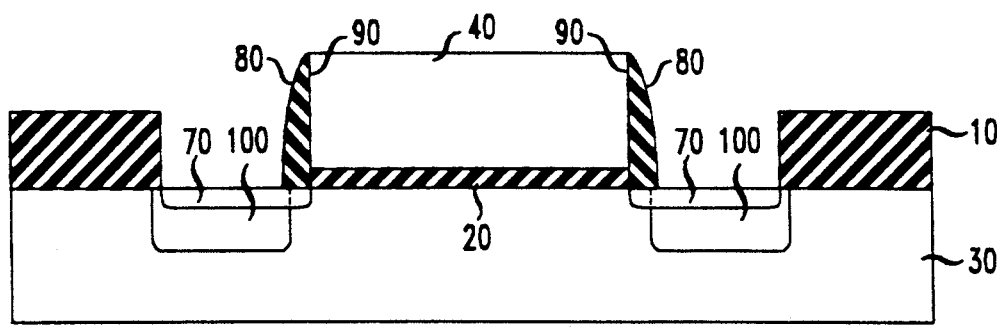
FIG. 2 is a schematic, cross-sectional view of the wafer of FIG. 1 at a later stage of processing.

Turning now to FIG. 2, silicon dioxide sidewalls 80 are conventionally formed on sides 90 of electrode 40 by chemical vapor deposition (CVD) from tetraethyl orthosilicate (TEOS), followed by reactive ion etching (RIE). These sidewalls shield the source and drain portions nearest the gate during a subsequent ion implantation step to form p+ deep source and drain junctions 100.

The MOSFETs are then completed in a process sequence that includes conventional silicidation and metallization steps for contact formation.

EXAMPLE 1

Silicon wafers were provided. These wafers were Czochralski-grown, n-type (100) wafers having resistivities of about 10–20 Ω-cm. Each wafer was cleaned in a sulfuric acid-hydrogen peroxide solution and in a hydrofluoric acid solution. The cleaned wafers were loaded into a RTCVD chamber and exposed to flowing hydrogen for 30 seconds at 900° C. to remove surface oxide. A boron-doped germanium layer was then grown from a reactant gas flow consisting of germane, and 1% diborane in hydrogen. In one set of experiments, the flow rate of the hydrogen-diborane mixture was varied from 2–20 SCCM with a fixed germane flow rate of 20 SCCM and a fixed substrate temperature of 630° C. In a second set of experiments, the diborane and germane flow rates were fixed at 20 SCCM and the substrate temperature was varied from 500° C.–630° C.

In the first set of experiments, we found that the boron concentration in the deposited germanium film varied linearly from about $1.6 \times 10^{21}$ cm$^{-3}$ at a diborane flow rate of 2 SCCM, to about $6.7 \times 10^{21}$ cm$^{-3}$ at a 20-SCCM diborane flow rate. We found that relatively high diborane flow rates promoted good coverage of the substrate surface by germanium film. For that reason, 20 SCCM was then most desirable of the flow rates that we tried, and even greater flow rates may be desirable. Clearly, boron concentrations of $6 \times 10^{21}$ cm$^{-3}$ or more are readily attainable at these diborane flow rates.

In the second set of experiments, we found that substrate temperatures of 500° C. or less to a hemispherical grain structure of the germanium film that is not desirable for making shallow junctions. That is, this structure may prevent uniform contact between germanium diffusion source and the underlying silicon surface. We also found that complete surface coverage could be achieved at temperatures of 630° C. or more, but that these temperatures led to a germanium layer having an undesirably rough top surface. Thus, a useful range of processing temperatures lies between these values. We found that a temperature of about 550° C. is preferable because it leads both to smooth surface topography and to complete coverage.

In another experiment, a silicon wafer was patterned by local oxidation using a conventional, polysilicon-buffered LOCOS process. A germanium layer, 300 Å thick, was then grown at 550° C. in 20 SCCM germane and 20 SCCM 1% diborane in hydrogen. Observations by Nomarski microscopy showed that the germanium was selectively deposited on the exposed silicon surfaces. There was no detectable deposition on the silicon dioxide layers.

EXAMPLE 2

Silicon wafers were patterned by local oxidation as described above. A 30-nm germanium layer was deposited on each wafer at 550° C. in 20 SCCM germane and 20 SCCM 1% diborane in hydrogen. The wafers were then subjected to rapid thermal annealing at 900° C. The annealing times (for selected wafers) were 15 s, 30 s, and 60 s. After annealing, the germanium layer was removed from each wafer by etching for five minutes at room temperature in a 1:1:5 $NH_4OH:H_2O_2:H_2O$ solution.

Cross-sectional transmission electron microscopy showed that the germanium layer was selectively deposited on the exposed silicon surfaces, with complete coverage of those surfaces. Annealing for 60 s caused some penetration of germanium into the silicon substrate, forming a layer of silicon intermixed with germanium. This layer was substantially removed by subsequent etching. Analysis of an etched wafer by secondary ion mass spectrometry (SIMS) showed that annealing for 60 s led to a junction depth (at a substrate doping level of $1 \times 10^{17}$ cm$^{-3}$) of about 40 nm.

The sheet resistances of the resulting p+ doped silicon regions were measured versus etching time. Regardless of the annealing time, the etching process exhibited self-limiting behavior, with sheet resistance reaching a plateau value after about five minutes of etching. This indicates that there will be relatively wide latitude in this etching step. The plateau value was about 600Ω per square for an annealing time of 15 s, about 470Ω per square for an annealing time of 30 s, and about 250Ω per square for an annealing time of 60 s. Thus, e.g., sheet resistances no more than about 260Ω per square are readily attainable by selecting an appropriate annealing time.

We measured current-voltage characteristics of the resulting p+–n junctions. In particular, we measured the reverse leakage current at a bias of 2.5 V. This current was the sum of an area-dependent component $J_aA$, and a perimeter-dependent component $J_pL$, where A and L represent, respectively, the area and the perimeter length of the junction. We obtained a value of 2 nA/cm$^2$ for $J_a$, and a value of 0.4 nA/cm$^2$ for $J_p$.

We claim:

1. A method for making at least one MOS transistor on a silicon substrate at least a portion of which is n-type, the method comprising the steps of:
   a) forming a layer of silicon dioxide material on a principal surface of the substrate, such principal surface overlying the n-type portion;
   b) patterning the silicon dioxide layer such that openings are formed in the portions of the layer overlying regions of the substrate that are to be defined as source and drain regions;
   c) depositing a layer of material that comprises boron on the principal surface in the source and drain regions; and d) heating the substrate such that at least some of the deposited boron diffuses into the source and drain regions, leading to the formation of p+—n junctions in the source and drain regions, Characterized in that e) the depositing step comprises depositing a boron-doped germanium layer from a reactive vapor that comprises a gaseous compound of boron, such that said layer has a boron content of at least about $1.5 \times 10^{21}$ atoms per cubic centimeter.

2. The method of claim 1, wherein the depositing step is carried out selectively, such that the germanium layer is formed only on exposed silicon regions of the substrate, and not on the silicon dioxide layer.

3. The method of claim 1, further comprising, after the heating step, the step of etching the principal surface such that the germanium layer is removed.

4. The method of claim 1, wherein the depositing step is carried out such that the resulting germanium layer has a boron content greater than $6 \times 10^{21}$ atoms per cubic centimeter.

5. The method of claim 1, wherein the depositing step comprises:
   a) placing the substrate within a reactor for rapid thermal chemical vapor deposition;
   b) flowing germane ($GeH_4$) through the reactor at a rate of about 20 standard cubic centimeters per minute (SCCM);
   c) during at least a portion of the germane-flowing step, flowing a gas mixture comprising about 1% diborane ($B_2H_6$) in hydrogen through the reactor at a rate of at least about 2 SCCM; and
   d) during at least a portion of the diborane-flowing step, heating the substrate.

6. The method of claim 5, wherein the flow rate of the gas mixture comprising diborane is at least about 20 SCCM.

7. The method of claim 5, wherein, during the diborane-flowing step, the substrate is heated to at least about 500° C., but not more than about 630° C.

8. The method of claim 5, wherein, during the diborane-flowing step, the substrate is heated to about 550° C.

9. The method of claim 1, wherein the depositing step is carried out such that the resulting germanium layer is about 30 nm thick.

10. The method of claim 1, wherein the substrate-heating step is carried out such that the effective depth of the resulting p+—n junctions is about 40 nm.

11. The method of claim 1, wherein, during the substrate-heating step, the substrate is heated to at least about 900° C.

12. The method of claim 1, wherein the substrate-heating step is carried out such that the resulting source and drain junctions have sheet resistances of no more than about 260 ohms per square.

13. The method of claim 3, wherein the etching step comprises exposing the principal surface to an etchant solution comprising ammonium hydroxide, hydrogen peroxide, and water.

14. The method of claim 3, wherein the etching step is carried out such that the germanium layer is etched at least 1000 times more rapidly than the silicon substrate would be etched in the absence of the germanium layer.

15. The method of claim 13, wherein the etching step is carried out such that the germanium layer is etched at least 1000 times more rapidly than the silicon substrate would be etched in the absence of the germanium layer.

* * * * *